United States Patent
Miyanaga et al.

(10) Patent No.: US 11,606,889 B2
(45) Date of Patent: Mar. 14, 2023

(54) CARBON MATERIAL FILLER FOR ELECTROMAGNETIC SHIELD, ELECTROMAGNETIC SHIELD MATERIAL, AND CARBON-MATERIAL-CONTAINING MOLDED BODY FOR ELECTROMAGNETIC SHIELD

(71) Applicants: NIPPON STEEL CHEMICAL & MATERIAL CO., LTD., Tokyo (JP); Mazda Motor Corporation, Aki-gun (JP)

(72) Inventors: Toshiaki Miyanaga, Tokyo (JP); Kazuhisa To, Aki-gun (JP); Nobuyoshi Kajioka, Aki-gun (JP); Junichi Ogawa, Aki-gun (JP); Kenji Hiramoto, Aki-gun (JP)

(73) Assignee: Mazda Motor Corporation, Aki-Gun (JP)

( * ) Notice: Subject to any disclaimer, the term of this patent is extended or adjusted under 35 U.S.C. 154(b) by 29 days.

(21) Appl. No.: 17/209,476

(22) Filed: Mar. 23, 2021

(65) Prior Publication Data
US 2021/0307222 A1 Sep. 30, 2021

(30) Foreign Application Priority Data
Mar. 31, 2020 (JP) .............................. JP2020-062905

(51) Int. Cl.
*H05K 9/00* (2006.01)
*C08K 3/04* (2006.01)
*C01B 32/05* (2017.01)

(52) U.S. Cl.
CPC ........... *H05K 9/0083* (2013.01); *C01B 32/05* (2017.08); *C08K 3/04* (2013.01); *C01P 2002/74* (2013.01); *C01P 2002/78* (2013.01); *C01P 2004/61* (2013.01); *C08K 2201/003* (2013.01)

(58) Field of Classification Search
None
See application file for complete search history.

(56) References Cited

U.S. PATENT DOCUMENTS

| | | | | |
|---|---|---|---|---|
| 5,688,483 A | * | 11/1997 | Zhang | .................... C01B 32/05 423/449.3 |
| 2004/0041130 A1 | * | 3/2004 | Yamamoto | ............ H01M 4/587 252/500 |
| 2006/0078796 A1 | * | 4/2006 | Ozaki | ............... H01M 10/0525 429/231.1 |

* cited by examiner

*Primary Examiner* — Tanisha Diggs
(74) *Attorney, Agent, or Firm* — Locke Lord LLP; James E. Armstrong, IV; Nicholas J. DiCeglie, Jr.

(57) ABSTRACT

Provided is carbon material filler for an electromagnetic shield, which includes a graphitizable carbon material to be mixed into a molding material in order to absorb electromagnetic waves, the carbon material filler for an electromagnetic shield satisfying (1) to (3): (1) A spacing d002 of a 002 plane of the graphitizable carbon material measured through X-ray diffraction measurement (XRD) is at least 0.338 nm. (2) A relative intensity ratio (A/B) value between a peak intensity (A) of a "002 plane" detected when the graphitizable carbon material is measured through X-ray diffraction measurement (XRD) and a higher peak intensity (B) that is selected from a "100 plane" and a "004 plane" is at least 2.5 and less than 27. (3) The filler is in powder form and the average particle diameter D50 is at least 1 µm and at most 5 mm.

18 Claims, 1 Drawing Sheet

CARBON MATERIAL FILLER FOR
ELECTROMAGNETIC SHIELD,
ELECTROMAGNETIC SHIELD MATERIAL,
AND CARBON-MATERIAL-CONTAINING
MOLDED BODY FOR ELECTROMAGNETIC
SHIELD

BACKGROUND OF THE INVENTION

1. Field of the Invention

The present invention relates to a carbon filler for an electromagnetic shield, and aims to provide a carbon material filler for an electromagnetic shield composed of a graphitizable carbon material, which has a lightness that could not be realized with a conventional material for an electromagnetic shield, and which enables expression of a high electromagnetic shield property.

2. Description of the Related Art

In recent years, various systems using mobile communication, and sensors, monitoring devices therefor, and the like that use radio waves have undergone remarkable evolution and proliferation, and have been widely installed also in common devices and the like in our everyday lives.

However, in ordinary applications in which communication systems are frequently used, in devices that use similar frequencies between different systems, it has been pointed out from the beginning that there is a possibility that a system will be influenced by other communication radio waves and malfunction will occur, and in fact, system breakdown caused by malfunction of sensors has been confirmed.

Also, with wireless radios, radios, and the like as well, when strong radio waves are used at similar frequencies, failure also occurs in which the system generates noise and can no longer be used.

For a countermeasure against such an incident, an electromagnetic shield material using conductive iron foil, metal netting, or thin copper fibers, a coating material that is constituted by a conductive coating material and has an electromagnetic shield property, and the like have been used heretofore.

In particular, in a resin molded product, since resin is not conductive, an attempt has been made to obtain an electromagnetic shield property by mixing a conductive metal filler, metal fibers, various carbon materials, and carbon fibers to obtain a conductive resin composition.

Among these, since carbon materials have a lower specific gravity compared to metal-based inorganic materials, they have been gaining attention as fillers for resin compositions having an electromagnetic shield property, and various development cases have been reported.

Japanese Patent Application Publication No. 2003-258491, Japanese Patent Application Publication No. 2000-95947, Japanese Patent Application Publication No. H08-172292, and Japanese Patent Application Publication No. 2014-133842 are documents relating to various carbon materials that are used in resin compositions having an electromagnetic shield property.

Japanese Patent Application Publication No. 2003-258491 proposes that a high electromagnetic shield property is obtained by defining the particle diameters of carbon black and graphite and using them together. In addition, Japanese Patent Application Publication No. 2000-95947 proposes a combination of expanded graphite and carbon fibers, and Japanese Patent Application Publication No. H08-172292 proposes a combination of furnace black and short carbon fibers. Furthermore, Japanese Patent Application Publication No. 2014-133842 proposes mixing carbon nanotubes, carbon black, and carbon fibers.

However, these carbon materials are not sufficient to obtain a sufficient electromagnetic shield property.

For this reason, Japanese Translation of PCT Application No. 2006-513120, Japanese Patent Application Publication No. H06-73248, and Japanese Patent Application Publication No. 2005-298653 propose obtaining a higher electromagnetic shield property by adding metal-based and inorganic conductive fillers to these combinations of various carbon materials.

Japanese Translation of PCT Application No. 2006-513120 proposes a carbon black composition in which carbon black and a metal component such as Ni are used together. Also, Japanese Patent Application Publication No. H06-73248 proposes adding together an inorganic filler, carbon black, and stainless steel fibers. Japanese Patent Application Publication No. 2005-298653 proposes a material in which carbon fibers and graphite coated with metal are used together. Japanese Patent Application Publication No. H06-251620 proposes using, as an electromagnetic shield material, a conductive powder material in which carbon (graphite) or a metal-based scale-like filler is used together with a thermally-treated coal coke powder.

However, although these proposed examples have high electromagnetic shield properties, they are not necessarily preferable as practical electromagnetic shield materials due to the fact that multiple materials need to be combined, the relative weights increase due to using metal-based materials, the use of carbon fibers increases the material cost, and the like.

SUMMARY OF THE INVENTION

As described above, although various materials having an electromagnetic shield property have been proposed, a case has not yet been seen in which a material that has a high electromagnetic shield property and satisfies lightness at a low cost is achieved also with a single carbon material.

An object of the present invention is to provide a carbon material filler for an electromagnetic shield composed of a graphitizable carbon material, which has a lightness that could not be realized with a conventional material for an electromagnetic shield and which enables expression of a high electromagnetic shield property.

As a result of intensive studying for improving these defects, the inventor of the present invention noted a relationship between the crystal structure of the carbon material and the electromagnetic shield property, and realized a graphitizable carbon material that expresses a high electromagnetic shield property while maintaining the lightness unique to the carbon material by structurally controlling the crystal structure of a graphitizable carbon material with a crystal structure that can be controlled and produced comparatively freely. That is, the inventor of the present invention achieved the present invention by restricting the composition ratio of a main crystal plane and a secondary crystal plane such that it falls within a certain range for a graphitizable carbon material with a crystal structure that can be controlled and produced comparatively freely.

The present invention is a carbon material filler for an electromagnetic shield including a graphitizable carbon material that is to be mixed into a resin material in order to absorb electromagnetic waves, and satisfies (1) to (3) below.

(1) A spacing d002 of a 002 plane of the graphitizable carbon material measured through X-ray diffraction measurement (XRD) is at least 0.338 nm.

(2) A relative intensity ratio (A/B) value between a peak intensity (A) of a "002 plane" detected when the graphitizable carbon material is measured through X-ray diffraction measurement (XRD) and a higher peak intensity (B) that is selected from a "100 plane" and a "004 plane" is at least 2.5 and less than 27.

(3) The carbon material filler is in powder form and has an average particle diameter D50 of at least 1 µm and at most 5 mm.

Regarding the carbon material filler for an electromagnetic shield of the present invention, it is preferable that the raw material of the graphitizable carbon material is a heavy oil derived from coal and/or petroleum, and furthermore, it is preferable that the raw material of the graphitizable carbon material is in the form of a powder with an average particle diameter D50 of at least 5 µm and at most 3 mm.

The present invention is an electromagnetic shield material in which the carbon material filler for an electromagnetic shield is mixed into a molding material selected from thermoplastic resin, thermosetting resin, or binder pitch.

The present invention is a carbon-material-containing molded body for an electromagnetic shield in which the carbon material filler for an electromagnetic shield is mixed into a molding material selected from a thermoplastic resin, a thermosetting resin, or a binder pitch, and is solidified.

DESCRIPTION OF THE PREFERRED EMBODIMENTS

Figure 1:
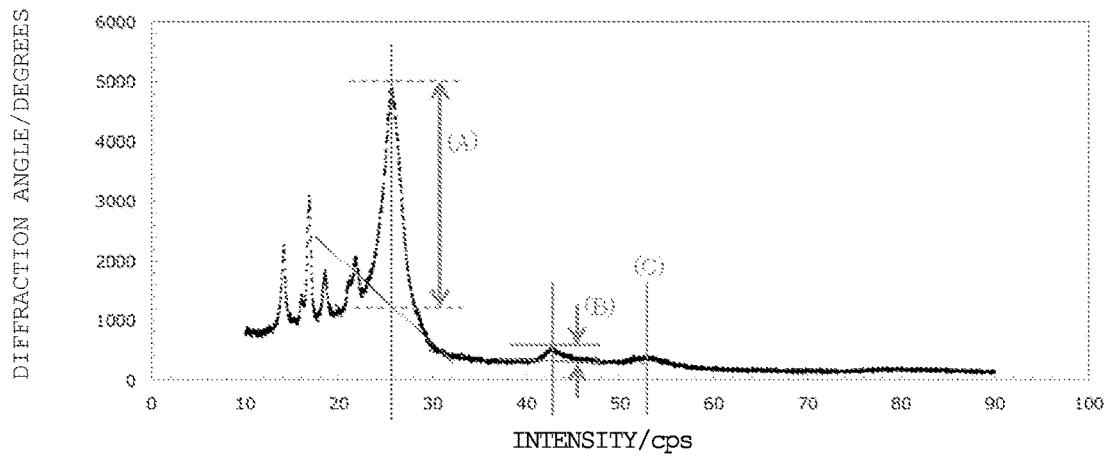
FIG. 1 is an XRD chart of Working Example 1 (electromagnetic shield: 62 dB)
Figure 2:
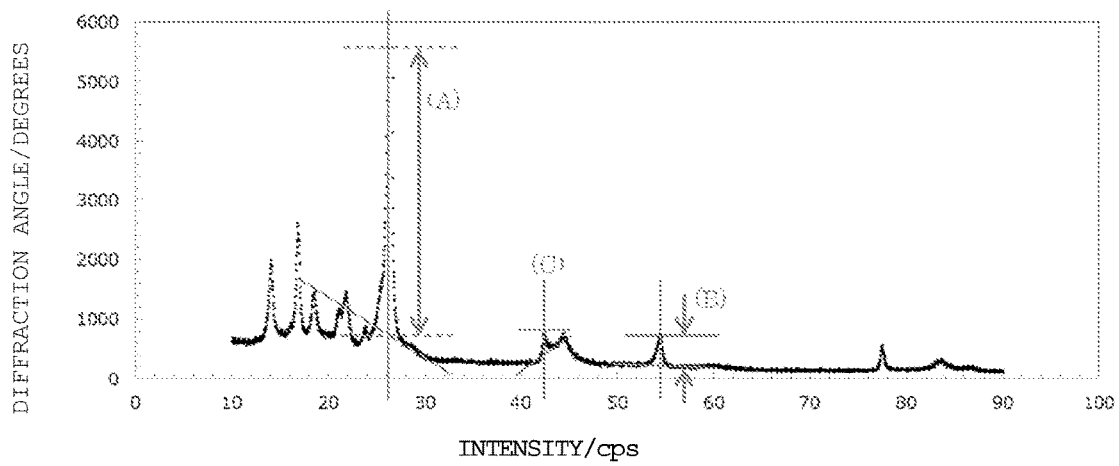
FIG. 2 is an XRD chart of Working Example 1 (electromagnetic shield: 11 dB).

Hereinafter, the present invention will be described in detail.

Although there are various types of carbon materials, such as graphite, coal, charcoal, carbon black, graphitizable carbon, and non-graphitizable carbon, the carbon material to be used as the carbon material filler for an electromagnetic shield of the present invention is required to be a graphitizable carbon material. Here, a graphitizable carbon material is a carbon material whose crystal structure easily changes due to the temperature at which and the historical time for which thermal treatment is performed, and is a carbon material that can ultimately have a graphite structure due to performing a thermal treatment of at least 2500° C.

More specifically, graphitizable carbon, which is the carbon material of the present invention, is preferably a carbon material in which the spacing d002 of the 002 plane, which is measured using an X-ray diffraction apparatus (XRD), is at least 0.338 nm, and is in a range of 0.343 to 0.360 nm. If the d002 is less than 0.338 nm, the graphitization of the carbon material will advance excessively, and therefore during pulverization, the carbon material will be in the form of scales, the plane area will increase excessively, and it will be difficult to fill resin or the like, or the crystal structure will deviate from a later-described crystal structure with a high electromagnetic shield property, and therefore a d002 of less than 0.338 nm is not suitable.

For the graphitizable carbon material serving as the carbon material filler for an electromagnetic shield of the present invention, a relative intensity ratio α (=A/B) value between a peak intensity (A) of the main crystal plane constituting the carbon material, that is, the "002 plane" detected when measured through X-ray diffraction measurement (XRD), and a higher peak intensity (B) that is selected from the "100 plane" and the "004 plane" is preferably at least 2.5 and less than 27, more preferably at least 16.0 and less than 26.5, and most preferably at least 19.0 and less than 26.0.

In the present invention, these peak heights (intensities) were measured, and the relative intensity ratio (A/B) of the peaks was calculated using the peak of the "002 plane" with the highest peak height as a first peak intensity (A) and the peak of a peak height that is higher than the other of one of the "100 plane" and the "004 plane" as a second peak intensity (B).

Due to the configuration ratio between the main crystal plane (002 plane) and the secondary crystal plane (100 plane or 004 plane) being set to be within the above-described predetermined range, it is possible to express a high electromagnetic shield property.

Note that the peak intensity of the main crystal plane (002 plane) is preferably at least 1000 cps, more preferably at least 5000 cps, and even more preferably at least 10000 cps. The upper limit is preferably at most 13000 cps, and more preferably at most 12000 cps.

Also, the peak intensity of the second crystal plane (100 plane or 004 plane) is preferably at least 100 cps and more preferably at least 200 cps. The upper limit is preferably at most 1000 cps and more preferably at most 700 cps.

The graphitizable carbon material serving as the carbon material filler for the electromagnetic shield of the present invention has a volume resistivity value that is at most 2.0 mΩcm. It is inferred that the electromagnetic shield property of the carbon material is in the electrical conductivity of the carbon material, and when the volume resistivity value is at most 2.0 mΩcm, even if the carbon material is used alone, an electromagnetic shield property of a certain degree can be expressed.

It is desirable that the carbon material filler for the electromagnetic shield of the present invention is in the form of powder with an average particle diameter D50 that is at least 1 µm and at most 5.0 mm. The particle diameter D50 is more preferably 5.0 µm to 3.0 mm, and most preferably 10.0 µm to 2.5 mm. Even if the D50 is a size that is at least 5.0 mm, the electromagnetic shield property is sufficiently expressed, but handling during kneading and molding will be difficult, and it will be difficult to produce a shape having a preferable hardness due to generation of voids and the like.

The ellipse length-to-width ratio of the shape of the carbon material filler is preferably 0.1 to 0.5, and more preferably 0.2 to 0.4. Due to the fact that the shape of the carbon material filler is influenced by the growth degree of the carbon crystals, it is possible to achieve a balance between the mixability of the filler and the electromagnetic shield performance due to the ellipse length-to-width ratio being in the above-described range.

Note that the ellipse length-to-width ratio is a numeric value obtained by observing a cross-section of the carbon material filler embedded in resin or the like using a method such as an SEM, obtaining the ellipse-equivalent short axis length (La) and the ellipse-equivalent long axis length (Lb), calculating an (La)/(Lb) ratio, performing this for several tens of particles or more, and finding the average thereof, and specifically, the ellipse length-to-width ratio can be analyzed using image analysis software (WinROOF: manufactured by Mitani Corporation) on a particle image observed using a method such as an SEM.

Petroleum, a petroleum-based heavy oil, a synthetic resin, or the like can be used as the raw material of the graphitizable carbon material that is to be the carbon material filler for the electromagnetic shield of the present invention, but it is preferable to use a heavy oil derived from coal or petroleum, and it is particularly preferable to use a coal-based heavy oil for which the yield of the carbon material is good due to having abundant aromatic attributes, the amount of a corrosive sulfur (S) component is low, and the amount of impurities and volatile components such as vanadium (V) and iron (Fe) is low.

Note that examples of petroleum-based heavy oils include petroleum-based pitch, asphalt, heavy oils, and heavy crude oil, examples of coal-based heavy oils include coal tar, which is a by-product of a coke furnace when manufacturing coke for iron manufacturing, which is to be used in a blast furnace, a tar-based heavy oil, and tar pitch. These may be hydrogenated, and a blend of coal-based heavy oils and petroleum-based heavy oils can also be used.

There is no particular limitation on the manufacturing method for the graphitizable carbon material in the present invention as long as it is a commonly-known method, but it is preferable to use delayed coking from the viewpoint that mass production is possible.

Hereinafter, although manufacture of a carbon material filler of the present invention using delayed coking will be described, there is no limitation to only the described method, and it is stated in advance that the carbon material filler of the present invention can be obtained also through a method other than delayed coking.

In the method of manufacturing the graphitizable carbon material from a coal-based heavy oil through delayed coking, a carbide of the heavy oil that is the raw material is first obtained by using a delayed coker or the like to advance thermal decomposition and a polycondensation reaction of a coal-based heavy oil, which is the raw material, for about 24 hours at a maximum temperature of about 400° C. to 700° C.

Next, the above-described carbide is roughly pulverized and sintered in a low-oxygen atmosphere at a maximum temperature of 800° C. to 1500° C. using a rotary kiln, and thereby the crystal structure of the graphitizable carbon material is adjusted so as to show XRD parameters that are preferable for the carbon material filler for the electromagnetic shield of the present invention.

The sintering processing removes moisture and volatile components in the carbide, and prompts the growth of the crystal by converting the hydrocarbon remaining as a polymer component into carbon, and the sintering temperature is preferably a range of 700 to 2000° C. and more preferably a range of 900 to 1500° C.

Note that in the carbide sintering processing, it is possible to use equipment such as a Riedhammer kiln, a shuttle kiln, a tunnel kiln, a roller hearth kiln, or a microwave instead of a rotary kiln as long as it is equipment in which thermal treatment can be performed in bulk, but there is no particular limitation to these. Also, these pieces of calcination processing equipment may be a continuous type or batch type.

The coal-based raw coke or coal-based calcined coke obtained as described above is adjusted to a predetermined particle size through pulverization and classification using a jet mill or the like after cooling, and thereafter is supplied as the carbon material filler for the electromagnetic shield.

Although the carbon material filler of the present invention has a sufficient electromagnetic shield effect when used alone, it is also possible to provide a wider-range electromagnetic shield performance by using a material such as a metal powder or a magnetic powder in addition thereto.

In terms of practical use, the carbon material filler for the electromagnetic shield of the present invention is used as a carbon-material-containing molded body for an electromagnetic shield that is solidified using thermoplastic resin, thermosetting resin, binder pitch, or the like as a binder when producing a molded body with a free shape. At this time, for example, although a molded body having an electromagnetic shield property can be produced also through cutting from a large ingot solid body of the graphitizable carbon material of the present invention, this method cannot be said to be preferable since the machining cost in practical use increases. Also, since it is envisioned that the carbon-material-containing molded body for the electromagnetic shield will be used in various forms, a thermoplastic resin or thermosetting resin for which conventional equipment can be used and handling also is not significantly different is more preferable as the binding agent.

It is more preferable to obtain an electromagnetic shield composite molded body by mixing and kneading the electromagnetic shield carbon material filler of the present invention into a thermoplastic resin such as polypropylene or nylon and thereafter performing injection or extrusion molding. The thus-obtained electromagnetic shield molded body can not only be widely deployed in the home appliance field, the industrial machinery field, the transportation and transit field, and the like, but is also lightweight since the carbon material filler is used, and therefore use in transit and transportation devices and the like in particular is optimal.

WORKING EXAMPLES

Hereinafter, although the present invention will be described in detail using working examples and comparative examples, the present invention is not limited in any way by these working examples. Note that in the following working examples, various types of measurement and evaluation are performed as follows.

Measurement of Electromagnetic Shield

The electromagnetic shield was measured with a KEC method evaluation device manufactured by Techno Science Japan in conformity with a KEC method developed by the KEC Electronic Industry Development Center, and the shield property of electromagnetic waves at a frequency of 1 MHz was evaluated. 50 dB or more was evaluated as "○".

Measurement of d002 by X-Ray Diffraction

The spacing (d) of the 002 plane of a sample measured using a DISCOVER-D8 manufactured by BRUKER was obtained through the Bragg formula $d=\lambda/\{2\times\mathrm{Sin}(\theta/2)\}$ based on the diffraction angle θ of the maximum peak intensity near 26° caused by the 002 plane. Note that λ was obtained using the wavelength 0.15405 nm of Kα1 of the used X-ray diffraction radiation source Cu.

Measurement of Peak Intensities and Proportion Thereof in X-Ray Diffraction

An X-ray diffraction chart at a diffraction angle of 10 to 90 degrees of the carbon material serving as the sample was measured using a DISCOVER-D8 manufactured by BRUKER, the peak intensities of the X-ray diffraction peak near 26° caused by the 002 plane, the X-ray diffraction peak near 43° caused by the 100 plane, and the X-ray diffraction peak near 54° caused by the 004 plane were calculated, the peak intensity (A) of the "002 plane" and a higher peak intensity (B) selected from the "100 plane" and the "004 plane" were set, and the relative intensity ratio (A/B) of those peaks was calculated.

Note that calculation of the peak intensity was performed by setting a line connecting the left and right inversion points of the diffraction peak as a baseline and setting the diffraction intensity (cps) of the length from a point of intersection between the baseline and the vertical line to the apex on a vertical line lowered to the horizontal axis of the graph from the peak of each apex as the peak height (intensity).

Method for Measuring Average Particle Diameter (D50)

Measurement was performed in an LA-920 (manufactured by HORIBA) using water+an activator (product name: Mama Lemon, manufactured by Lion Corporation) as a dispersion medium. Note that the volume average particle diameter was used as the average particle diameter (D50).

Working Examples 1 to 4, Comparative Examples 1 to 3

Seven types of graphitizable carbon materials with different crystal structures were produced by performing a thermal decomposition and polycondensation reaction at a temperature of about 500° C. for about 24 hours using delayed coking, that is, a delayed coker, with a heavy oil derived from coal as the raw material to obtain raw coke, and thereafter performing sintering at a total of seven levels of maximum temperatures within a range of 800° C. to 1800° C. in a low-oxygen atmosphere using a rotary kiln. These several types of graphitizable carbon materials were pulverized and classified with a jet mill such that D50 was at most 25 μm, and thus the carbon material fillers for an electromagnetic shield were obtained. The crystal structures of the obtained carbon material fillers for an electromagnetic shield were measured through X-ray diffraction. Thereafter, a commercially-available polypropylene resin was used as a binding agent, 60 parts by mass of the carbon material filler for the electromagnetic shield and 40 parts by mass of the polypropylene resin were mixed and were solidified using an injection molding device, whereby a 150 mm×150 mm×thickness 3 mm flat plate was produced. Measurement of the electromagnetic shield property was performed using this flat plate (molded body). The results are shown in Table 1.

Working Examples 5 to 7, Comparative Examples 4 and 5

The same graphitizable carbon material as in Working Example 3 was used, and carbon material fillers for an electromagnetic shield with various types of particle sizes D50 were then solidified using a binding agent in similar way except that the pulverization conditions were changed, and thereby a flat plate (carbon-material-containing molded body for an electromagnetic shield) was produced.

The electromagnetic shield property was measured using this flat plate, and evaluation of the moldability was also performed.

The results are shown in Table 2. Note that in all of Working Examples 5 to 7, the moldability was favorable (○), but in Comparative Example 4 (D50: 0.5 μm), the moldability was poor (Δ) due to an increase in viscosity, and in Comparative Example (D50: 5,500 μm), the molded body was fragile and the flat plate could not be created (x).

TABLE 2

| | D50 (μm) | Electromagnetic shield | Moldability | Evaluation |
|---|---|---|---|---|
| Example 5 | 22 | 66 dB | ○ | ○ |
| Example 6 | 35 | 56 dB | ○ | ○ |
| Example 7 | 2,500 | 65 dB | ○ | ○ |
| Comparative Ex. 4 | 0.5 | 11 dB | Δ | × |
| Comparative Ex. 5 | 5,500 | — | × | × |

As can be seen from the results of the Working Examples and Comparative Examples in Table 1, it was confirmed that carbon material fillers for electromagnetic shields with high electromagnetic shield properties were obtained by controlling the structure by suitably selecting the relative intensity ratio (A/B) values between the peak intensity (A) of the main crystal plane constituting the carbon material of the graphitizable carbon material, which is the carbon material filler for the electromagnetic shield, that is, the "002 plane", which is detected when measured through X-ray diffraction measurement (XRD), and a higher peak intensity (B) that is selected from the "100 plane" and the "004 plane".

Also, as can be seen from the results of the Working Examples and the Comparative Examples in Table 2, it was

TABLE 1

| | Intensity of first peak (A) | | | Intensity of second peak (B) | | | Electromagnetic shield | Evaluation |
|---|---|---|---|---|---|---|---|---|
| | d002 | Plane | Intensity | Plane | Intensity | A/B | | |
| Example 1 | 0.350 | (002) | 352 cps | (100) | 139 cps | 2.5 | 62 dB | ○ |
| Example 2 | 0.347 | (002) | 4,052 cps | (100) | 239 cps | 16.9 | 63 dB | ○ |
| Example 3 | 0.347 | (002) | 4,160 cps | (100) | 215 cps | 19.3 | 65 dB | ○ |
| Example 4 | 0.343 | (002) | 10,156 cps | (004) | 392 cps | 25.9 | 73 dB | ○ |
| Comparative Ex.1 | 0.337 | (002) | 264 cps | (004) | 188 cps | 1.4 | 11 dB | X |
| Comparative Ex.2 | 0.342 | (002) | 580 cps | (100) | 262 cps | 2.2 | 30 dB | X |
| Comparative Ex.3 | 0.337 | (002) | 14,869 cps | (004) | 543 cps | 27.4 | 31 dB | X | confirmed that a carbon material filler with a high electromagnetic shield property and excellent moldability can be obtained in a predetermined particle size range since the ease of practical use differs when the particle size differs, even if the same graphitizable carbon material is used.

INDUSTRIAL APPLICABILITY

According to the present invention, it is possible to express a high electromagnetic shield property even with a single filler due to using a specific graphitizable carbon material filler as the carbon material filler for the electromagnetic shield. A composition formed by containing this graphitizable carbon material filler in a resin material or a binder pitch is useful as an electromagnetic shield material, and it is possible to provide a carbon-material-containing molded body for an electromagnetic shield that is lightweight and easy to machine into various shapes by molding and solidifying this electromagnetic shield material.

What is claimed is:

1. A carbon material filler for an electromagnetic shield comprising a graphitizable carbon material to be mixed into a molding material in order to absorb electromagnetic waves, wherein the carbon material filler for an electromagnetic shield satisfies (1) to (3) below:
   (1) A spacing d002 of a 002 plane of the graphitizable carbon material measured through X-ray diffraction measurement (XRD) is at least 0.338 nm,
   (2) A relative intensity ratio (A/B) value between a peak intensity (A) of a "002 plane" detected when the graphitizable carbon material is measured through X-ray diffraction measurement (XRD) and a higher peak intensity (B) that is selected from a "100 plane" and a "004 plane" is at least 16.0 and less than 27,
   (3) The filler is in powder form and the average particle diameter D50 is at least 1 μm and at most 5 mm.

2. The carbon material filler for an electromagnetic shield according to claim 1, wherein a raw material of the graphitizable carbon material is a heavy oil derived from coal and/or petroleum.

3. The carbon material filler for an electromagnetic shield according to claim 1, wherein an average particle diameter D50 is at least 5 μm and at most 3 mm.

4. The carbon material filler for an electromagnetic shield according to claim 2, wherein an average particle diameter D50 is at least 5 μm and at most 3 mm.

5. A carbon material filler for an electromagnetic shield according to claim 1, wherein (1) A spacing d002 of a 002 plane of the graphitizable carbon material measured through X-ray diffraction measurement (XRD) is in a range of 0.343 to 0.360 nm.

6. A carbon material filler for an electromagnetic shield according to claim 1, wherein (2) A relative intensity ratio (A/B) value between a peak intensity (A) of a "002 plane" detected when the graphitizable carbon material is measured through X-ray diffraction measurement (XRD) and a higher peak intensity (B) that is selected from a "100 plane" and a "004 plane" is at least 16 and less than 27, and the peak intensity of the main crystal plane (002 plane) is at least 1000 cps.

7. A carbon material filler for an electromagnetic shield according to claim 6, wherein the peak intensity of the main crystal plane (002 plane) is at least 1000 cps and at most 13000 cps.

8. A carbon material filler for an electromagnetic shield according to claim 1, wherein (2) A relative intensity ratio (A/B) value between a peak intensity (A) of a "002 plane" detected when the graphitizable carbon material is measured through X-ray diffraction measurement (XRD) and a higher peak intensity (B) that is selected from a "100 plane" and a "004 plane" is at least 16 and less than 27, and the peak intensity of the second crystal plane (100 plane or 004 plane) is at least 100 cps.

9. A carbon material filler for an electromagnetic shield according to claim 8, wherein the peak intensity of the second crystal plane (100 plane or 004 plane) is at least 100 cps and at most 700 cps.

10. A carbon material filler for an electromagnetic shield according to claim 1, wherein the ellipse length-to-width ratio of the shape of the carbon material filler is 0.1 to 0.5.

11. An electromagnetic shield material, wherein the carbon material filler for an electromagnetic shield according to claim 1 is mixed into a molding material selected from thermoplastic resin, thermosetting resin, or binder pitch.

12. An electromagnetic shield material, wherein the carbon material filler for an electromagnetic shield according to claim 2 is mixed into a molding material selected from thermoplastic resin, thermosetting resin, or binder pitch.

13. An electromagnetic shield material, wherein the carbon material filler for an electromagnetic shield according to claim 3 is mixed into a molding material selected from thermoplastic resin, thermosetting resin, or binder pitch.

14. An electromagnetic shield material, wherein the carbon material filler for an electromagnetic shield according to claim 4 is mixed into a molding material selected from thermoplastic resin, thermosetting resin, or binder pitch.

15. A carbon-material-containing molded body for an electromagnetic shield, wherein the carbon material filler for an electromagnetic shield according to claim 1 is mixed into a molding material selected from thermoplastic resin, thermosetting resin, or binder pitch, and is solidified.

16. A carbon-material-containing molded body for an electromagnetic shield, wherein the carbon material filler for an electromagnetic shield according to claim 2 is mixed into a molding material selected from thermoplastic resin, thermosetting resin, or binder pitch, and is solidified.

17. A carbon-material-containing molded body for an electromagnetic shield, wherein the carbon material filler for an electromagnetic shield according to claim 3 is mixed into a molding material selected from thermoplastic resin, thermosetting resin, or binder pitch, and is solidified.

18. A carbon-material-containing molded body for an electromagnetic shield, wherein the carbon material filler for an electromagnetic shield according to claim 4 is mixed into a molding material selected from thermoplastic resin, thermosetting resin, or binder pitch, and is solidified.

* * * * *